(12) United States Patent
Lee et al.

(10) Patent No.: US 10,998,334 B2
(45) Date of Patent: May 4, 2021

(54) THREE-DIMENSIONAL SEMICONDUCTOR MEMORY DEVICES

(71) Applicant: Samsung Electronics Co., Ltd., Suwon-si (KR)

(72) Inventors: Bongyong Lee, Suwon-si (KR); Minkyung Bae, Hwaseong-si (KR); Myunghun Woo, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/536,842

(22) Filed: Aug. 9, 2019

(65) Prior Publication Data

US 2020/0203372 A1     Jun. 25, 2020

(30) Foreign Application Priority Data

Dec. 21, 2018   (KR) .................. 10-2018-0167335

(51) Int. Cl.
| | |
|---|---|
| *H01L 27/11582* | (2017.01) |
| *H01L 27/11565* | (2017.01) |
| *H01L 23/522* | (2006.01) |
| *H01L 21/225* | (2006.01) |
| *H01L 21/3205* | (2006.01) |

(52) U.S. Cl.
CPC .... *H01L 27/11582* (2013.01); *H01L 23/5226* (2013.01); *H01L 27/11565* (2013.01); *H01L 21/2257* (2013.01); *H01L 21/32055* (2013.01)

(58) Field of Classification Search
CPC ..................... H01L 27/11582; H01L 21/32055

USPC ......................................................... 257/314
See application file for complete search history.

(56) References Cited

U.S. PATENT DOCUMENTS

| | | | |
|---|---|---|---|
| 8,537,615 B2 | 9/2013 | Maeda | |
| 8,592,873 B2 | 11/2013 | Kim et al. | |
| 8,717,814 B2 | 5/2014 | Choi et al. | |
| 9,412,821 B2 | 8/2016 | Simsek-Ege et al. | |
| 9,613,980 B2 | 4/2017 | Yamada et al. | |
| 9,916,901 B1 | 3/2018 | Saito et al. | |
| 2008/0179659 A1* | 7/2008 | Enda | H01L 27/11582 257/326 |
| 2009/0173981 A1* | 7/2009 | Nitta | H01L 27/115 257/302 |
| 2014/0138756 A1* | 5/2014 | Son | H01L 29/7841 257/315 |
| 2014/0367762 A1* | 12/2014 | Tian | H01L 27/11556 257/321 |
| 2017/0084624 A1* | 3/2017 | Lee | H01L 27/1157 |
| 2018/0006055 A1 | 1/2018 | Kim et al. | |

* cited by examiner

*Primary Examiner* — Dzung Tran
(74) *Attorney, Agent, or Firm* — Muir Patent Law, PLLC

(57) ABSTRACT

A three-dimensional semiconductor memory device may include a stack including gate electrodes sequentially stacked on a substrate and a vertical structure penetrating the stack. The vertical structure may include a vertical channel portion, a charge storing structure on an outer side surface of the vertical channel portion, and a pad. The pad may include a first pad portion disposed in an internal space surrounded by the vertical channel portion and a second pad portion provided on the first pad portion and extended onto a top surface of the charge storing structure. A portion of the first pad portion may be disposed at the same level as an uppermost electrode of the gate electrodes.

20 Claims, 17 Drawing Sheets

THREE-DIMENSIONAL SEMICONDUCTOR MEMORY DEVICES

CROSS-REFERENCE TO RELATED APPLICATIONS

This U.S. non-provisional patent application claims priority under 35 U.S.C. § 119 to Korean Patent Application No. 10-2018-0167335, filed on Dec. 21, 2018, in the Korean Intellectual Property Office, the entire contents of which are hereby incorporated by reference.

BACKGROUND OF THE INVENTION

The present disclosure relates to a three-dimensional semiconductor memory device, and in particular, to a three-dimensional semiconductor memory device with improved electrical characteristics.

Higher integration of semiconductor memory devices is required to satisfy consumer demands for superior performance and inexpensive prices. In the case of semiconductor memory devices, since their integration is an important factor in determining product prices, increased integration is especially required. In the case of two-dimensional or planar semiconductor memory devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. To overcome such a limitation, three-dimensional semiconductor memory devices including three-dimensionally arranged memory cells have recently been proposed.

SUMMARY

An example embodiment of the inventive concept provides a three-dimensional semiconductor memory device with improved electric characteristics.

According to an example embodiment, the disclosure is directed to a three-dimensional semiconductor memory device, comprising: a stack including gate electrodes sequentially stacked on a substrate; and a vertical structure penetrating the stack, the vertical structure comprising a vertical channel portion, a charge storing structure on an outer side surface of the vertical channel portion, and a pad, wherein the pad comprises: a first pad portion disposed in an internal space of the vertical structure and surrounded by the vertical channel portion; and a second pad portion provided on the first pad portion and extended onto a top surface of the charge storing structure, and wherein a portion of the first pad portion is disposed at a same level as an uppermost electrode of the gate electrodes.

According to an example embodiment, the disclosure is directed to a three-dimensional semiconductor memory device, comprising: a stack including gate electrodes sequentially stacked on a substrate; and a vertical structure penetrating the stack, the vertical structure comprising a vertical channel portion, a charge storing structure on an outer side surface of the vertical channel portion, and a pad, wherein the gate electrodes comprise a ground selection gate electrode, a cell gate electrode, a string selection gate electrode, and an erase gate electrode, which are sequentially stacked on the substrate, wherein the pad comprises: a first pad portion disposed in an internal space of the vertical structure and surrounded by the vertical channel portion; and a second pad portion provided on the first pad portion and extended onto a top surface of the charge storing structure, and wherein a portion of the first pad portion is horizontally overlapped with the erase gate electrode.

According to an example embodiment, the disclosure is directed to a three-dimensional semiconductor memory device, comprising: a stack including gate electrodes sequentially stacked on a substrate; and a vertical structure penetrating the stack and including a vertical channel portion and a pad on the vertical channel portion, wherein the pad comprises a first pad portion in an internal space of the vertical structure and surrounded by the vertical channel portion and a second pad portion on the first pad portion, wherein the first pad portion comprises a first portion of a first conductivity type, and wherein the first portion of the first pad portion is horizontally overlapped with an uppermost electrode of the gate electrodes.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
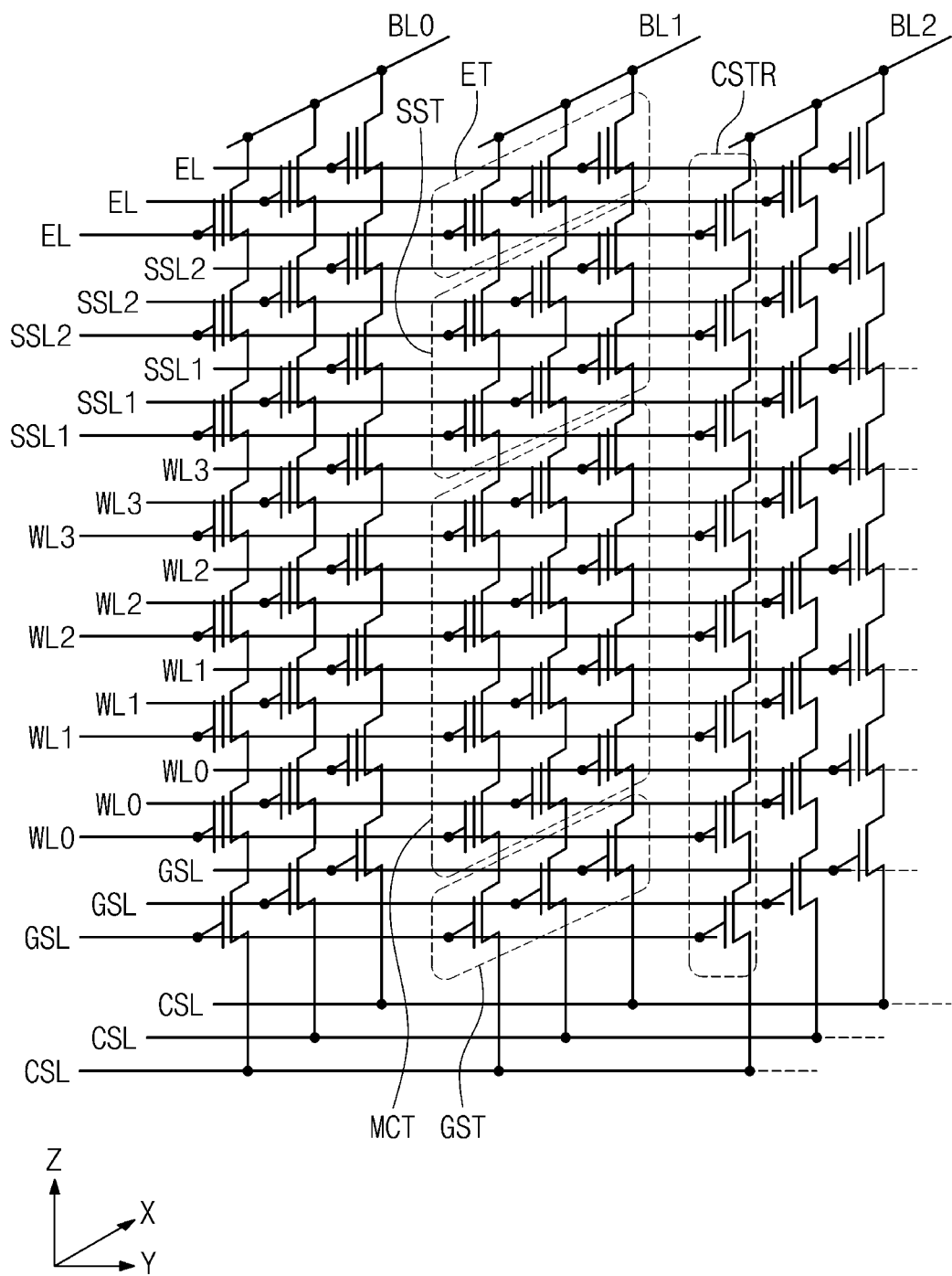
FIG. 1 is a circuit diagram schematically illustrating a cell array of a three-dimensional semiconductor memory device, according to an example embodiment of the inventive concept.

FIG. 1 is a circuit diagram schematically illustrating a cell array of a three-dimensional semiconductor memory device, according to an example embodiment of the inventive concept.

Referring to FIG. 1, a three-dimensional semiconductor memory device may include a common source line CSL, a plurality of bit lines BL0-BL2, and a plurality of cell strings CSTR disposed between the common source line CSL and the bit lines BL0-BL2.

The common source line CSL may be a conductive layer disposed on a semiconductor substrate or an impurity region formed in the semiconductor substrate. The bit lines BL0-BL2 may be conductive patterns (e.g., metal lines), which are disposed over the substrate and are spaced apart from the semiconductor substrate. The bit lines BL0-BL2 may be two-dimensionally arranged on the semiconductor substrate, and a plurality of the cell strings CSTR may be connected in parallel to each of the bit lines BL0-BL2. Thus, the cell strings CSTR may be two-dimensionally arranged on the common source line CSL or the semiconductor substrate.

Each of the cell strings CSTR may include or consist of a ground selection transistor GST coupled to the common source line CSL, an erase control transistor ET connected to the bit lines BL0-BL2, one or more string selection transistors SST disposed between the erase control transistor ET and the ground selection transistor GST, and a plurality of memory cell transistors MCT disposed between the ground selection transistor GST and the string selection transistors SST. The ground selection transistor GST, the string selection transistors SST, the memory cell transistors MCT, and the erase control transistor ET may be connected in series. Although each cell string CSTR is illustrated to have just one erase control transistor ET, each cell string CSTR may include two or more erase control transistors ET. Furthermore, a ground selection line GSL, a plurality of word lines WL0-WL3, a plurality of string selection lines SSL1-SSL2, and an erase control line EL may be used as gate electrodes of the ground selection transistor GST, the memory cell transistors MCT, the string selection transistors SST, and the erase control transistor ET, respectively. In the case where two erase control transistors ET are provided in each cell string CSTR, two erase control lines EL may be provided between the string selection lines SSL1-SSL2 and the bit lines BL0-BL2.

Gate electrodes of the memory cell transistors MCT, which are placed at substantially the same distance from the common source lines CSL, may be connected in common to one of the word lines WL0-WL3, thereby being in an equipotential state. In an example embodiment, even if the gate electrodes of the memory cell transistors MCT are placed at substantially the same level from the common source lines CSL, the gate electrodes in respective rows or columns may be independently controlled. Items described as "substantially the same," "substantially equal," or "substantially constant," may be exactly the same, equal, or constant, or may be the same, equal, or constant within acceptable variations that may occur, for example, due to manufacturing processes.

The ground selection lines GSL and string selection lines SSL1 and SSL2 may extend in a second direction Y and may be spaced apart from each other in a first direction X crossing the second direction Y. The ground selection lines GSL or the string selection lines SSL1 and SSL2, which are placed at substantially the same level from the common source lines CSL, may be electrically separated from each other. In addition, the erase control lines EL, which are placed at substantially the same level from the common source lines CSL, may be electrically separated from each other. In some embodiments, although not illustrated in the drawings, the erase control transistors ET in a plurality of the cell strings CSTR may be controlled in common by one of the erase control lines EL. The erase control transistors ET may be configured to induce a gate-induced-drain leakage (GIDL) during an erase operation on the memory cell array.

In the erase operation, an erase voltage or a first voltage may be applied to the bit lines BL0-BL2, and a second voltage lower than the first voltage may be applied to the erase control lines EL. When the erase operation is performed, the string selection lines SSL1 and SSL2 and the common source line CSL may be disconnected from any signal line with a fixed voltage, thereby being in a floating state, and the word lines WL0-WL3 may be grounded.

Figure 2:
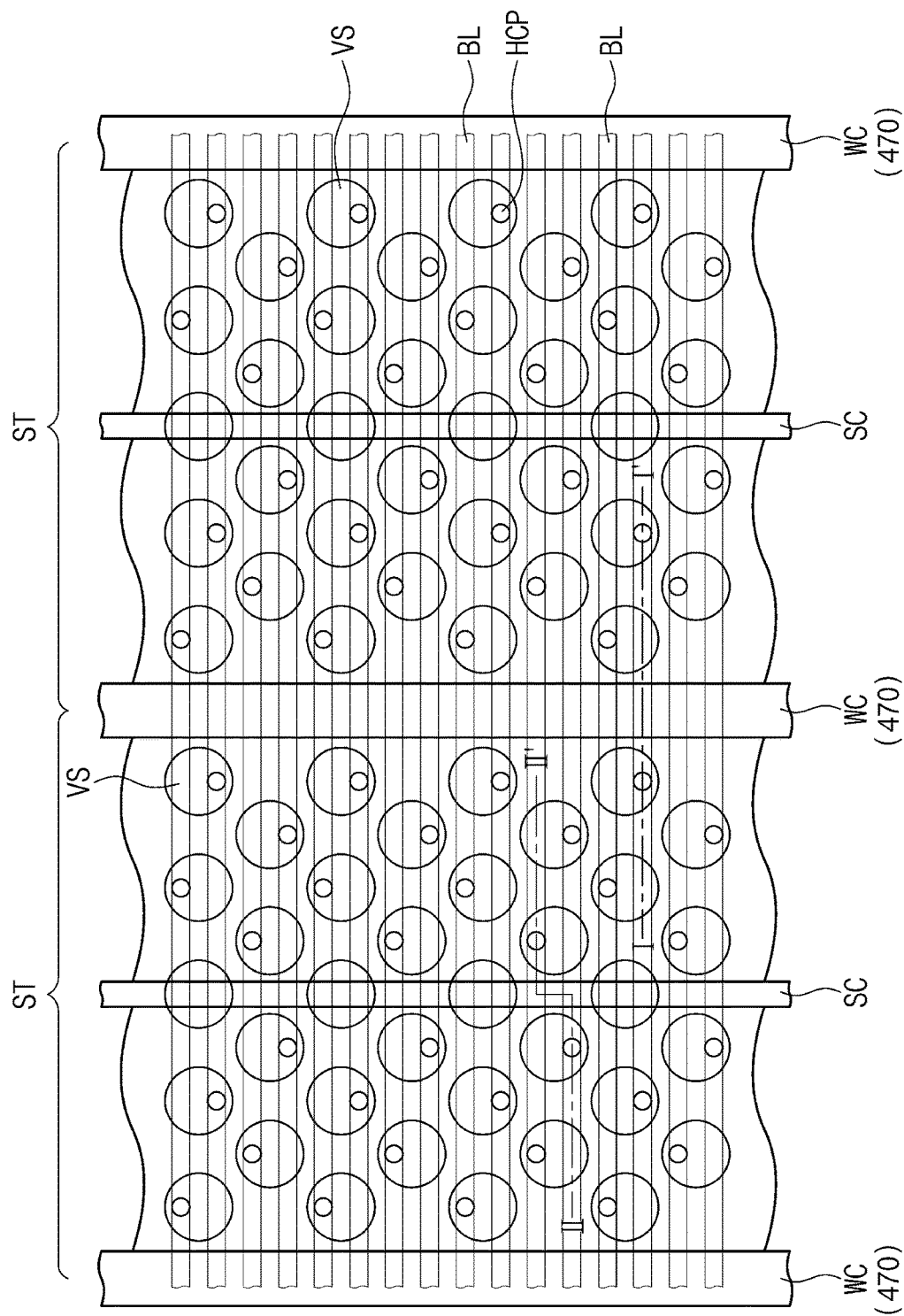
FIG. 2 is a plan view illustrating a three-dimensional semiconductor memory device, according to an example embodiment of the inventive concept.
Figure 3:
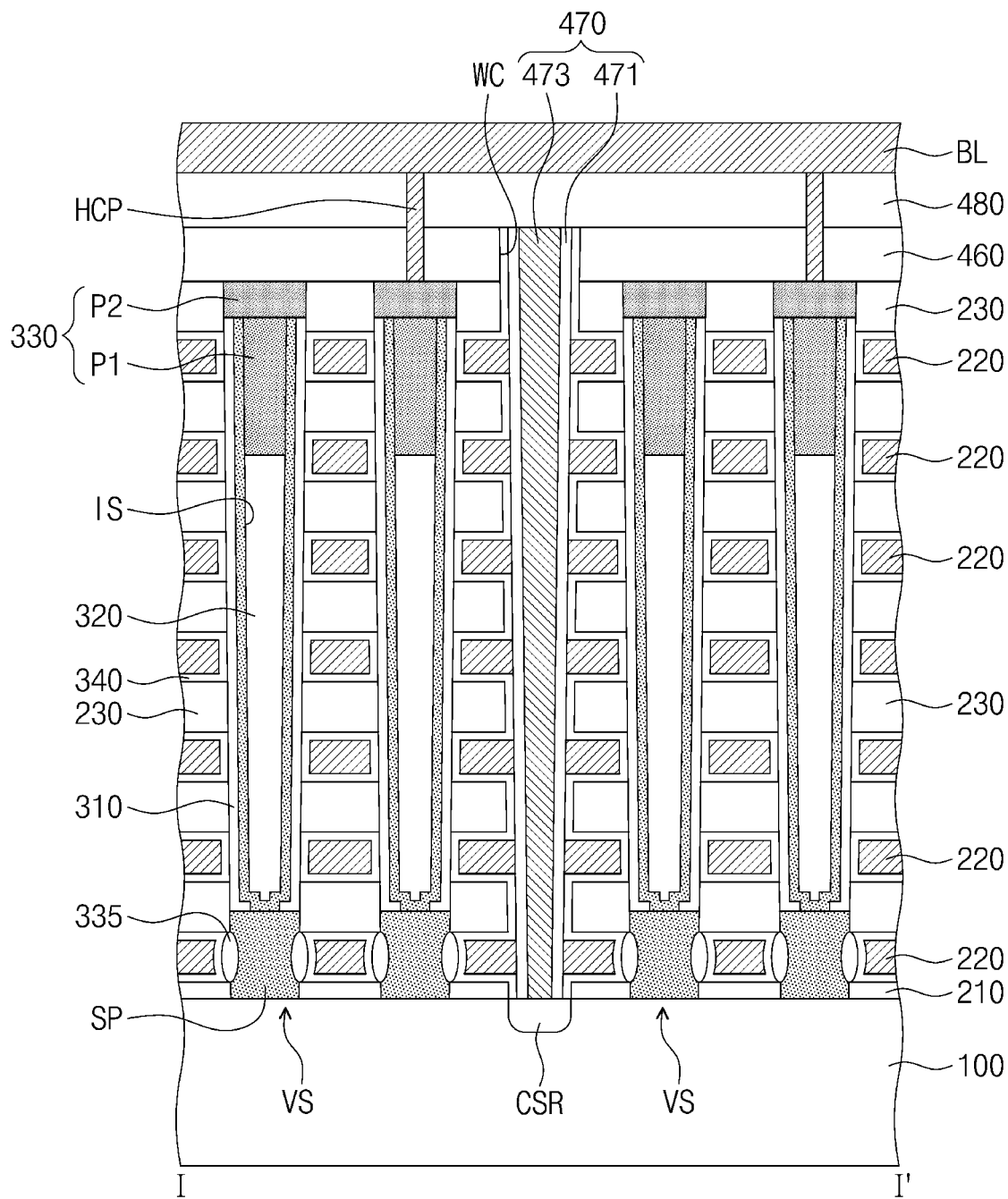
FIG. 3 is a sectional view taken along a line I-I' of FIG. 2.
Figure 4:
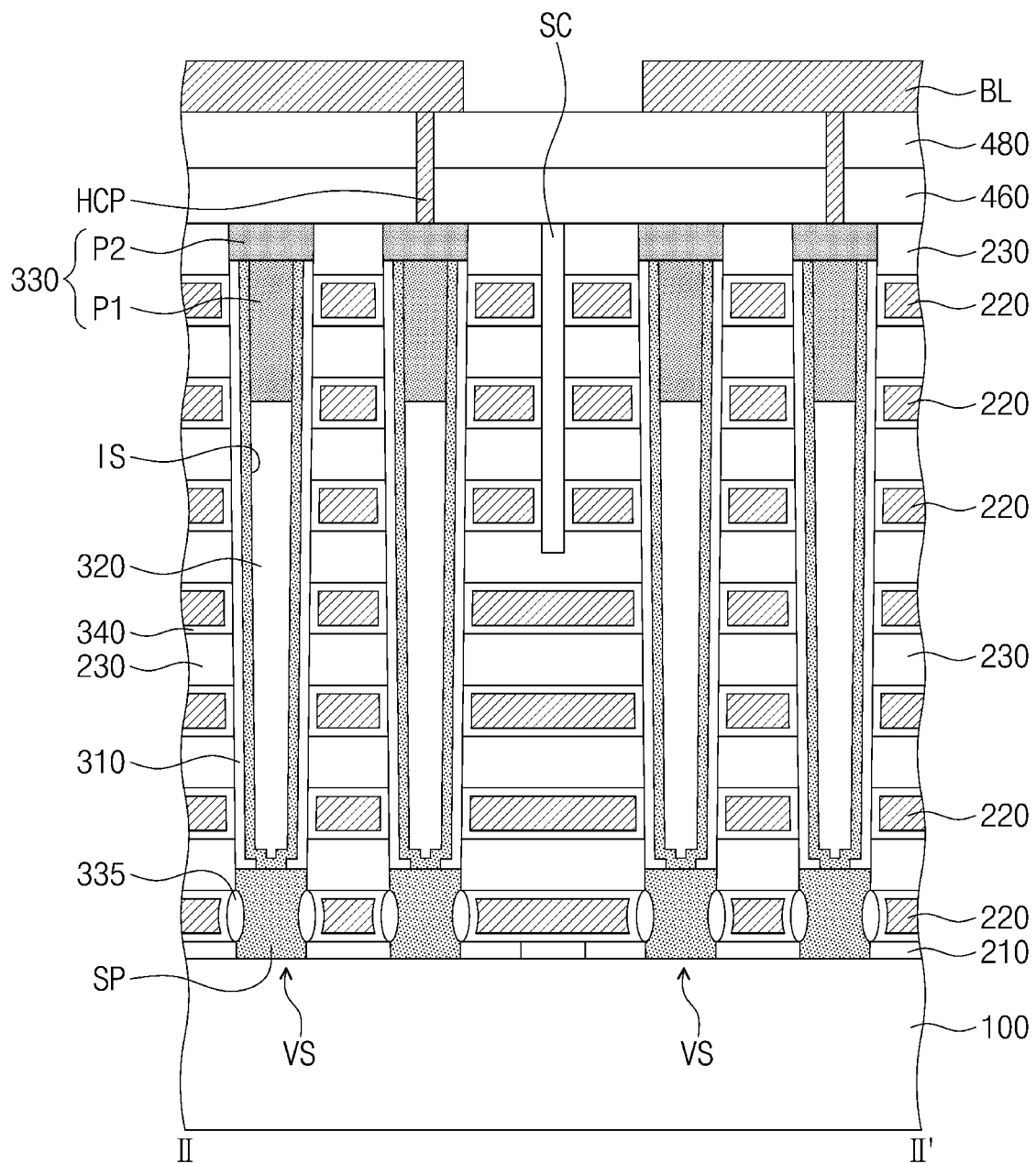
FIG. 4 is a sectional view taken along a line II-II' of FIG. 2.
Figure 5:
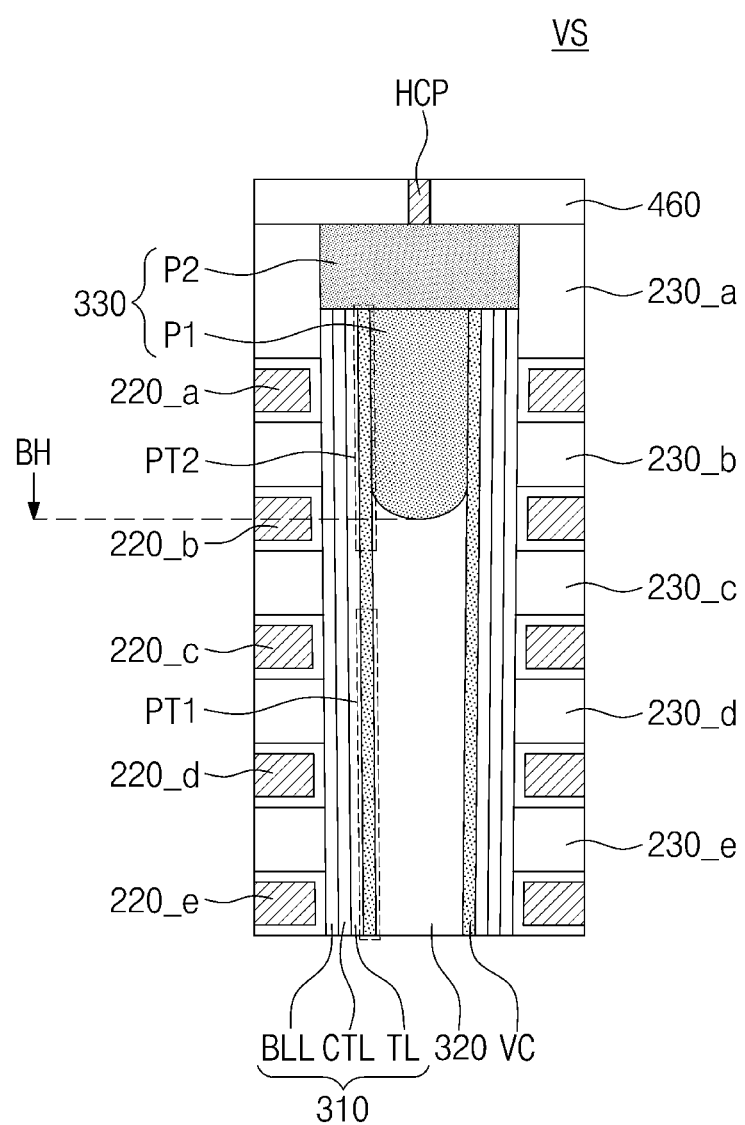
FIG. 5 is an enlarged sectional view illustrating an upper portion of the vertical structure of FIG. 3.

FIG. 2 is a plan view illustrating a three-dimensional semiconductor memory device, according to an example embodiment of the inventive concept. FIG. 3 is a sectional view taken along a line I-I' of FIG. 2. FIG. 4 is a sectional view taken along a line II-II' of FIG. 2. FIG. 5 is an enlarged sectional view illustrating an upper portion of a vertical structure VS of FIG. 3.

Referring to FIGS. 2 to 5, stacks ST may be disposed on a substrate 100. The substrate 100 may be, for example, a silicon substrate, a silicon-germanium substrate, a germanium substrate, or a single-crystalline epitaxial layer grown on a single-crystalline silicon substrate. Common source regions CSR may be disposed in the substrate 100 between the stacks ST. The common source regions CSR may extend lengthwise in the second direction Y. An item, layer, or portion of an item or layer described as extending "lengthwise" in a particular direction has a length in the particular direction and a width perpendicular to that direction, where the length is greater than the width. The common source regions CSR may have a conductivity type different from the substrate 100. As an example, the common source regions CSR may have a first conductivity type, and the substrate 100 may have a second conductivity type. The first conductivity type may be an n-type, and the second conductivity type may be a p-type. The stacks ST may be spaced apart from each other in the first direction X with separation trenches WC interposed therebetween. The separation trenches WC may be provided on the common source regions CSR.

The stacks ST may be spaced apart from each other in the first direction X and may extend in the second direction Y crossing the first direction X. Each of the stacks ST may include a buffer oxide layer 210, and gate electrodes 220 and insulating patterns 230, which are alternately and repeatedly stacked on the buffer oxide layer 210. The buffer oxide layer 210 may cover a top surface of the substrate 100. The buffer oxide layer 210 may include, for example, a thermally-grown oxide layer or a silicon oxide layer. The gate electrodes 220 may include at least one ground selection gate electrode, cell gate electrodes, at least one string selection gate electrode, and at least one erase gate electrode. The ground selection gate electrode may be the lowermost electrode of the gate electrodes 220, and the erase gate electrode may be the uppermost electrode of the gate electrodes 220. In some example embodiments, the uppermost and second uppermost electrodes of the gate electrodes 220 may be used as the erase gate electrodes. The cell gate electrodes and the string selection gate electrodes may be disposed between the ground selection gate electrode and the erase gate electrode. The cell gate electrodes may be disposed between the ground selection gate electrode and the string selection gate electrodes. The string selection gate electrodes may be disposed between the uppermost electrode of the cell gate electrodes and the erase gate electrode.

As an example, as shown in FIG. 5, an uppermost electrode 220_a (hereinafter, a first gate electrode) and a second uppermost electrode 220_b (hereinafter, a second gate electrode) may be used as the erase gate electrodes. A third uppermost electrode 220_c (hereinafter, a third gate electrode) and a fourth uppermost electrode 220_d (hereinafter, a fourth gate electrode) may be used as the string selection gate electrodes. A fifth uppermost electrode 220_e (hereinafter, a fifth gate electrode) and other gate electrodes thereunder may be used as the cell gate electrodes. The gate electrodes 220 may be formed of or may include at least one of, for example, doped silicon, metals (e.g., tungsten), metal nitrides, metal silicides, or any combination thereof.

The insulating patterns 230 may be disposed between the gate electrodes 220, which are placed adjacent to each other in a third direction Z perpendicular to the top surface of the substrate 100, and on the first gate electrode 220_a. The majority of the insulating patterns 230 may have the same thickness, and at least one of the insulating patterns 230 may be thicker than other insulating patterns. For example, an uppermost insulating pattern (hereinafter, a first insulating pattern) 230_a may be thicker than underlying insulating patterns 230_b, 230_c, 230_d, and 230_e. The first insulating pattern 230_a may be thicker by at least two times than the underlying insulating patterns 230_b, 230_c, 230_d, and 230_e. Each of the underlying insulating patterns 230_b, 230_c, 230_d, and 230_e may have the same thickness. The insulating patterns 230 may be formed of or may include, for example, silicon oxide. The semiconductor device may include a cell array region, in which memory cells are provided, and a contact region, in which the gate electrodes 220 and contacts are connected to each other. In the contact region, the stacks ST may have a staircase structure. For example, a height of each of the stacks ST may decrease with increasing distance from the cell array region. For example, a length of each of the gate electrodes 220 in the second direction Y may decrease with increasing distance from the substrate 100 in the Z direction.

Vertical structures VS may be provided to penetrate the stacks ST. Each of the vertical structures VS may include a vertical channel portion VC and a charge storing structure 310 surrounding the vertical channel portion VC. Each of the vertical structures VS may include an internal space IS, which is formed in the vertical channel portion VC, and a gap-fill layer 320, which is surrounded by the internal space IS. Each of the vertical structures VS may include a pad 330 provided in an upper portion thereof. The vertical structures VS may be arranged in a zigzag shape or in a line shape, when viewed top down. The vertical channel portions VC may have a hollow pipe shape, a cylindrical shape, or a cup shape. For example, each of the vertical channel portions VC may have a closed bottom. The vertical channel portions VC may be electrically connected to the substrate 100. The vertical channel portions VC may include a single layer or a plurality of layers. The vertical channel portions VC may include at least one of, for example, a single crystalline silicon layer, an organic semiconductor layer, or carbon nanostructures.

Semiconductor pillars SP may be disposed between the vertical channel portions VC and the substrate 100. The semiconductor pillars SP may be disposed on the top surface of the substrate 100 to penetrate the lowermost gate electrode 220. The semiconductor pillars SP and the vertical channel portions VC may be in contact with each other. The semiconductor pillars SP may be semiconductor patterns having the same conductivity type as the substrate 100 or intrinsic semiconductor patterns. The charge storing structures 310 may be disposed between the vertical channel portions VC and the gate electrodes 220. The charge storing structures 310 may extend along outer sidewalls of the vertical channel portions VC and in the third direction Z. For example, the charge storing structures 310 may have a shape surrounding the outer sidewalls of the vertical channel portions VC. The charge storing structures 310 may include at least one of, for example, a silicon oxide layer, a silicon nitride layer, a silicon oxynitride layer, and high-k dielectric layers and may have a single- or multi-layered structure.

As shown in FIG. 5, each of the charge storing structures 310 may include a tunnel insulating layer TL, a blocking insulating layer BLL, and a charge storing layer CTL. The tunnel insulating layer TL may be disposed adjacent to each of the vertical channel portions VC to enclose or cover the outer sidewall of the vertical channel portion VC. The blocking insulating layer BLL may be disposed adjacent to the gate electrodes 220. The charge storing layer CTL may be disposed between the tunnel insulating layer TL and the blocking insulating layer BLL. The tunnel insulating layer TL may include, for example, a silicon oxide layer or a high-k dielectric layer (e.g., aluminum oxide ($Al_2O_3$) or hafnium oxide ($HfO_2$)). The blocking insulating layer BLL may include, for example, a silicon oxide layer or a high-k dielectric layer (e.g., aluminum oxide ($Al_2O_3$) or hafnium oxide ($HfO_2$)). The charge storing layer CTL may include, for example, a silicon nitride layer. The gap-fill layers 320 may include, for example, a silicon oxide layer, a silicon nitride layer, or a silicon oxynitride layer.

The pad 330 may include a first pad portion P1 provided in the internal spaces IS and a second pad portion P2 provided on the first pad portion P1. The first pad portion P1 may be disposed on top surfaces of the gap-fill layer 320. A top surface of the first pad portion P1 may be substantially coplanar with a top surface of the vertical channel portion VC. The second pad portion P2 may be laterally extended to cover the top surface of the vertical channel portion VC and a top surface of the charge storing structure 310. The second pad portion P2 may cover at least one of a top surface of the tunnel insulating layer TL, a top surface of the charge storing layer CTL, and a top surface of the blocking insulating layer BLL. For example, as shown in FIG. 5, the second pad portion P2 may cover all of the top surfaces of the tunnel insulating layer TL, the charge storing layer CTL, and the blocking insulating layer BLL and may be in contact with a side surface of the first insulating pattern 230_a. The first pad portion P1 may have a convex bottom surface protruding toward the gap-fill layer 320, but in an example embodiment, the first pad portion P1 may have a substantially flat bottom surface. The gap-fill layer 320 may contact the bottom surface of the first pad portion P1, and a top surface of the gap-fill layer 320 may have a convex bottom surface in the direction of the substrate 100.

The second pad portion P2 may include a semiconductor material that is doped with impurities of the first conductivity type. As an example, the second pad portion P2 may be a highly doped n-type region. A concentration of the first conductivity type impurity in the second pad portion P2 may be substantially constant. For example, the first conductivity type impurity may have a substantially even distribution in the second pad portion P2. The first pad portion P1 may be in an intrinsic or undoped state when it is initially deposited, and thereafter, may be doped with the first conductivity type impurities, which are diffused from the second pad portion P2 during a subsequent thermal process. In this case, at least a portion of the first pad portion P1 may be doped to have the first conductivity type. In an example embodiment, the entirety of the first pad portion P1 from the top surface to the bottom surface may have the first conductivity type. A concentration of the first conductivity type impurity in the first pad portion P1 may be substantially constant. For example, the first conductivity type impurity may have a substantially even distribution in the first pad portion P1. Alternatively, the concentration of the first conductivity type impurity in the first pad portion P1 may be higher in its upper portion than in its lower portion. For example, the concentration of the first conductivity type impurity of the first pad portion P1 may increase continuously or discontinuously in an upward direction.

In the case where the first gate electrode 220_a and the second gate electrode 220_b are used as the erase gate electrodes, a lowermost surface BH of the first pad portion P1 may be placed at substantially the same vertical level as the second gate electrode 220_b. The lowermost surface BH of the first pad portion P1 may be located at a vertical level higher than the top surface of the string selection gate electrode (i.e., the third gate electrode 220_c). The first pad portion P1 may be horizontally overlapped with the first gate electrode 220_a and may be horizontally overlapped with at least a portion of the second gate electrode 220_b. As used herein, the terms "horizontally overlapped" or "horizontally overlapping" may refer to structures, patterns, and/or layers that have portions on the same vertical level (or horizontal plane). As one example, structures, patterns, and/or layers that are "horizontally overlapped" may appear overlapped in a horizontal direction (e.g., the X or Y directions) when viewed in cross-section.

The vertical channel portion VC may include a second vertical channel portion PT2, which is located adjacent to the first gate electrode 220_a and the second gate electrode 220_b, and a first vertical channel portion PT1, which is located adjacent to the third gate electrode 220_c and other underlying gate electrodes. The first vertical channel portion PT1 may be substantially in an intrinsic state. The second vertical channel portion PT2 may have the first conductivity type. The second vertical channel portion PT2 may be in an intrinsic or undoped state when it is initially deposited, and thereafter, may be doped with the first conductivity type impurities, which are diffused from the second pad portion P2 and the first pad portion P1 during a subsequent thermal process. As an example, a vertical profile of an impurity concentration of the second vertical channel portion PT2 may have substantially the same as the first pad portion P1. Impurities in the second vertical channel portion PT2 and the pad 330 may increase an amount of an electric current that is transferred from the first gate electrode 220_a and the second gate electrode 220_b serving as the erase gate electrodes to the vertical channel portion VC, and this may make it possible to improve an erase operation property of the semiconductor device.

As used herein, structures, patterns, and/or layers described as being "substantially in an intrinsic state" may be structures, patterns, and/or layers that are undoped, but which may include dopants or impurities that migrate or otherwise transfer from neighboring or adjacent components that are doped. For example, the first vertical channel portion PT1 may not be doped, but may include dopants that migrate from the second vertical channel portion PT2 and/or migrate during the process of doping the second vertical channel portion PT2.

The vertical channel portion VC and the pad 330 may be formed of a semiconductor material (e.g., silicon). As an example, the vertical channel portion VC and the pad 330 may include poly silicon. The vertical channel portion VC and the pad 330 may have different crystallographic structures from each other. As an example, a grain density of the vertical channel portion VC may be higher than that of the first pad portion P1. Since the vertical channel portion VC and the first pad portion P1 are formed by separate processes, there may be a difference in crystal growth direction and/or crystal orientation between the vertical channel portion VC and the first pad portion P1. As will be described in the following fabricating method, a planarization process and/or an etching process may be performed between processes for forming the first pad portion P1 and the second pad portion P2, and in this case, there may be a crystallographically discontinuous interface between the first pad portion P1 and the second pad portion P2.

Since the first pad portion P1 is horizontally overlapped with the erase gate electrodes, impurities of the first conductivity type may be sufficiently supplied to the second vertical channel portion PT2, which is placed adjacent to the first pad portion P1, during a fabrication process. Thus, the semiconductor device may have an improved erase operation property. The second pad portion P2 may have a larger width or larger planar area than the first pad portion P1, and this may make it possible to sufficiently supply impurities of the first conductivity type to the first pad portion P1. Furthermore, due to its large width, the second pad portion P2 may have a larger grain size than the first pad portion P1, and the first conductivity type impurities in the second pad portion P2 may be sufficiently supplied to the first pad portion P1. In addition, due to the large width of the second pad portion P2, it may be easy to align a channel contact plug HCP to the second pad portion P2, when a channel contact plug HCP is formed on the second pad portion P2.

As described previously with reference to FIG. 1, in the erase operation, the erase voltage and the first voltage may be applied to bit lines BL, and the second voltage, which is lower than the first voltage, may be applied to the erase gate electrodes 220_a and 220_b. Due to a difference in voltage between the pads 330 and the erase gate electrodes 220_a and 220_b, a GIDL phenomenon may occur in the erase transistor including the erase gate electrodes 220_a and 220_b. According to an example embodiment of the inventive concept, at least a portion of the pads 330 may be disposed to be horizontally overlapped with the erase gate electrodes 220_a and 220_b, and this may make it possible to easily induce the GIDL phenomenon between the pads 330 and the gate electrode 220_d. In the case where the GIDL phenomenon occurs, electron-hole pairs may be produced in the vertical channel portion VC, which is overlapped with between the pads 330 and the erase gate electrodes 220_a and 220_b, and in this case, electrons may be moved toward the pads 330 and holes may be supplied to the vertical channel portions VC. Thus, it may be possible to effectively provide the holes into the charge storing layers CTL from the vertical channel portions VC, during the erase operation, and consequently to improve an erase operation property of the three-dimensional semiconductor memory device.

A gate insulating layer 335 may be disposed between the semiconductor pillar SP and the lowermost gate electrode. Side surfaces of the gate insulating layer 335 may have curved surfaces that are convex in opposite directions. The gate insulating layer 335 may include, for example, a thermally-grown oxide layer. A horizontal insulating layer 340 may be disposed between the charge storing structures 310 and the gate electrodes 220 and may be extended to cover top and bottom surfaces of the gate electrodes 220. The horizontal insulating layer 340 maybe, for example, a silicon oxide layer (e.g., $SiO_2$) or a high-k dielectric layer (e.g., aluminum oxide ($Al_2O_3$) or hafnium oxide ($HfO_2$)).

A first interlayered insulating layer 460 may be disposed on the stacks ST. The first interlayered insulating layer 460 may cover the top surface of the uppermost insulating pattern 230_a and the top surfaces of the pads 330. For example, a bottom surface of the first interlayered insulating layer 460 may contact the top surface of the uppermost insulating pattern 230_a and the top surfaces of the second pad portions P2 of the pads 330. The first interlayered insulating layer 460 may include, for example, a silicon oxide layer. Contact structures 470 may be disposed between the stacks ST. The contact structures 470 may extend in the second direction Y and may penetrate the first interlayered insulating layer 460. When viewed in a plan view, the contact structures 470 may have a rectangular or line shape extending lengthwise in the second direction Y. In an example embodiment, the contact structures 470 may be arranged along the common source region CSR or in the second direction Y. Here, when viewed in cross-section, the contact structures 470 may have a pillar shape. Each of the contact structures 470 may include a spacer 471 and a common source contact 473. The common source contact 473 may be electrically connected to the common source region CSR. The common source contact 473 may include, for example, a metal material (e.g., tungsten, copper, or aluminum) or a transition metal material (e.g., titanium or tantalum). The spacer 471 may cover a side surface of the common source contact 473. The spacer 471 may include, for example, an insulating material (e.g., silicon oxide or silicon nitride).

Insulating isolation layers SC may be disposed between the contact structures 470. In each of the stacks ST, the insulating isolation layer SC may extend in the second direction Y and may divide the string selection gate electrode(s) and the erase gate electrode(s) in a horizontal direction. In an example of FIG. 5, the insulating isolation layer SC may penetrate the first to fourth gate electrodes 220_a, 220_b, 220_c, and 220_d, but not the fifth gate electrode 220_e. For example, a bottom surface of the insulating isolation layer SC may be located at a vertical level between the fifth gate electrode 220_e and the fourth gate electrode 220_d. The insulating isolation layer SC may include an insulating material (e.g., silicon oxide or silicon nitride).

A second interlayered insulating layer 480 may be disposed on the first interlayered insulating layer 460. The second interlayered insulating layer 480 may cover top surfaces of the contact structures 470 and a top surface of the first interlayered insulating layer 460. For example, the second interlayered insulating layer 480 may contact top surfaces of the spacer 471 and the common source contact 473 and a top surface of the first interlayered insulating layer 460. The second interlayered insulating layer 480 may include, for example, a silicon oxide layer. The channel contact plugs HCP may be disposed on the vertical structures VS. The channel contact plugs HCP may penetrate the second and first interlayered insulating layers 460 and 480 and may be in direct contact with the pads 330. The channel contact plugs HCP may include at least one of, for example, metal materials (e.g., copper or tungsten) and metal nitrides (e.g., TiN, TaN, or WIN).

The bit lines BL may be disposed on the second interlayered insulating layer 480. The bit lines BL may extend in the first direction X and may cross the stacks ST. On the second interlayered insulating layer 480, the bit lines BL may be spaced apart from each other in the second direction Y. Each of the bit lines BL may be electrically connected to the vertical structures VS arranged along the first direction X. The bit lines BL may include, for example, a metal material.

FIGS. 6 to 9 are enlarged sectional views, each of which illustrates a portion (e.g., an upper portion of the vertical structure VS of FIG. 3) of a three-dimensional semiconductor memory device according to example embodiments of the inventive concept. For concise description, a previously described element may be identified by a similar or identical reference number without repeating an overlapping description thereof.

Figure 6:
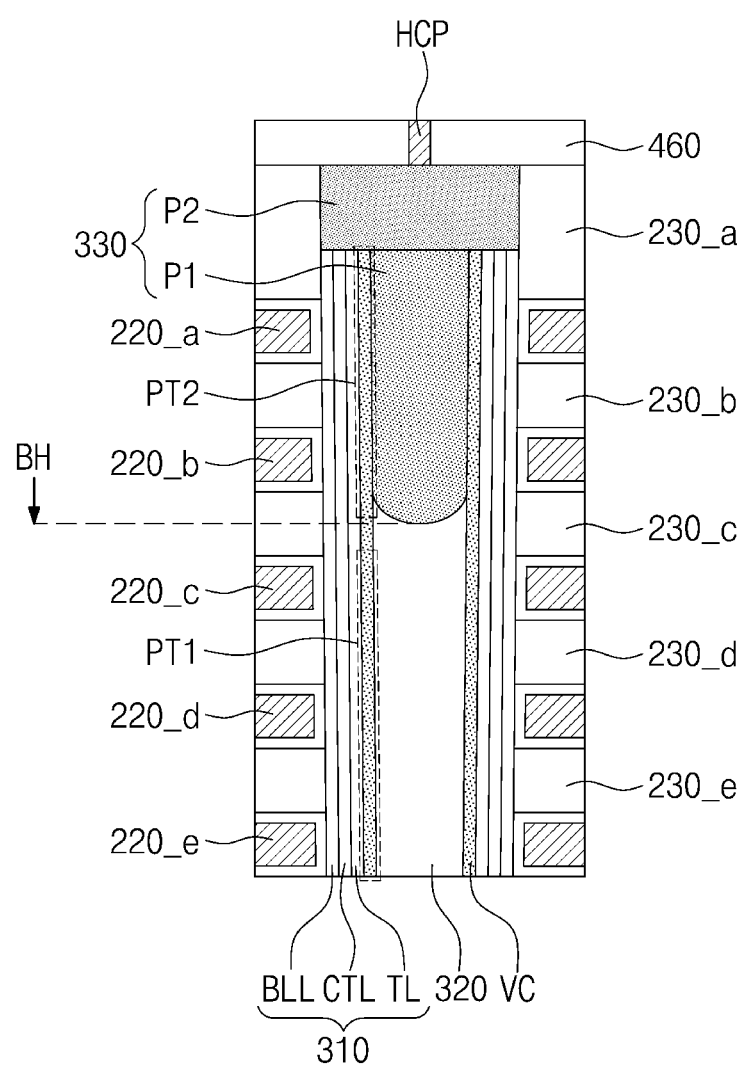
FIGS. 6 to 9 are enlarged sectional views, each of which illustrates a portion (e.g., an upper portion of the vertical structure of FIG. 3) of a three-dimensional semiconductor memory device, according to an example embodiment of the inventive concept.

Referring to FIG. 6, the first gate electrode 220_a and the second gate electrode 220_b may be used as the erase gate electrodes, and the third gate electrode 220_c may be used as the string selection gate electrode. In FIG. 6, the lowermost surface BH of the first pad portion P1 may be located at a level lower than the bottom surface of the second gate electrode 220_b, and at a level higher than the top surface of the third gate electrode 220_c. For example, the lowermost surface BH of the first pad portion P1 may be placed between the second gate electrode 220_b and the third gate electrode 220_c.

Figure 7:
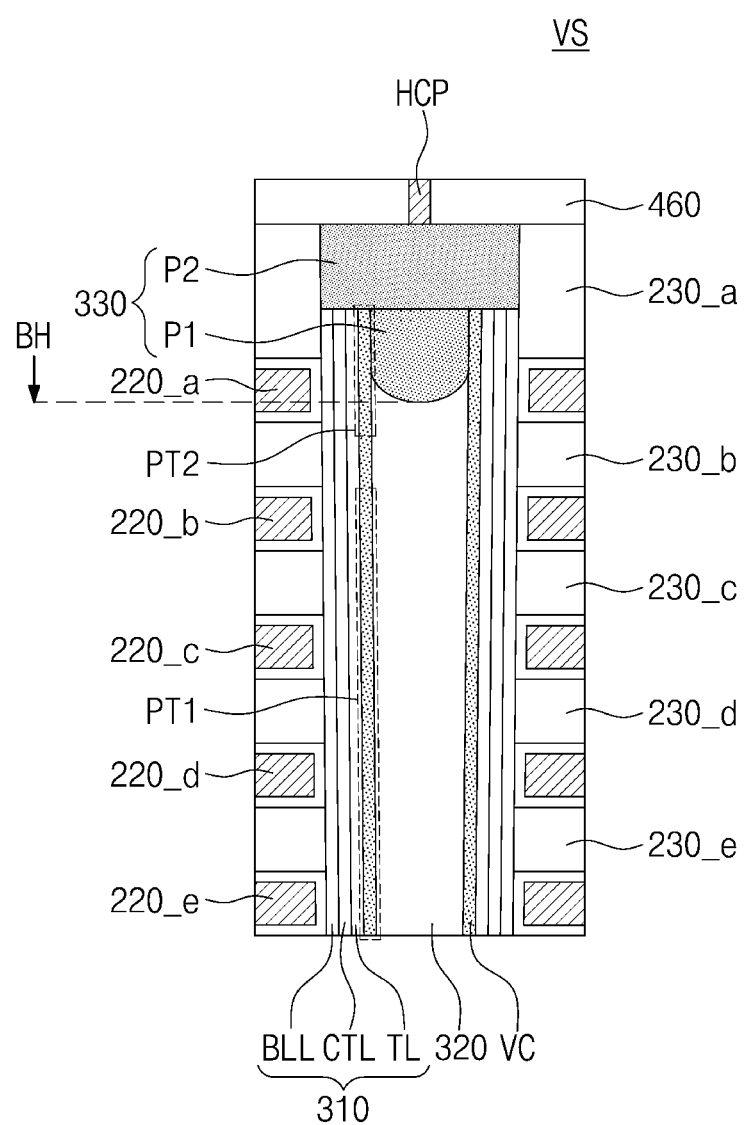

Referring to FIG. 7, the first gate electrode 220_a may be used as the erase gate electrode, and the second gate electrode 220_b and the third gate electrode 220_c may be used as the string selection gate electrodes. The fourth gate electrode 220_d may be used as the cell gate electrode. The lowermost surface BH of the first pad portion P1 may be horizontally overlapped with the first gate electrode 220_a. For example, the lowermost surface BH of the first pad portion P1 may be located at a level between the first gate electrode 220_a and the second gate electrode 220_b. The first vertical channel portion PT1 may be a region, which is located adjacent to the second gate electrode 220_b and other gate electrodes therebelow, and the second vertical channel portion PT2 may be a region, which is located adjacent to the first gate electrode 220_a. The first vertical channel portion PT1 may be substantially in an intrinsic state, and the second vertical channel portion PT2 may have a first conductivity type.

Figure 8:
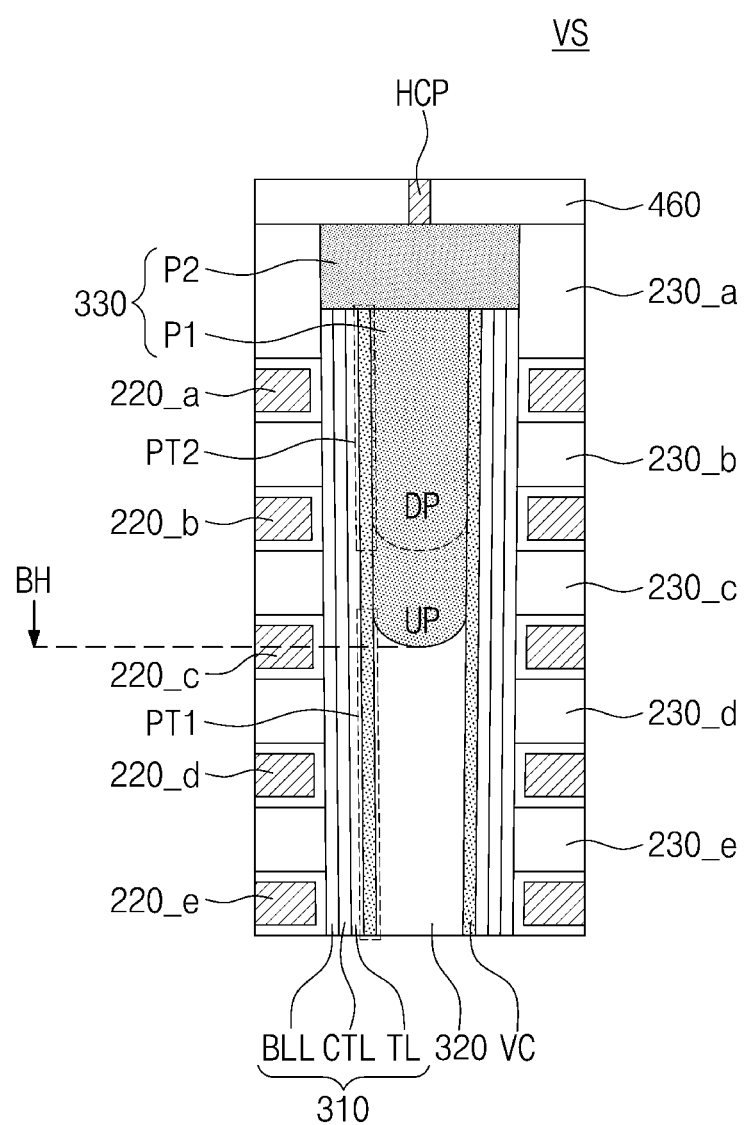

Referring to FIG. 8, the first pad portion P1 may include a doped region DP, which has a first conductivity type, and an undoped region UP, which is disposed below the doped region DP and is substantially in an intrinsic state. In an example embodiment, the doped region DP may have an impurity concentration continuously increasing in an upward direction. The undoped region UP of the first pad portion P1 may be horizontally overlapped with the third gate electrode 220_c, which serves as the string selection gate electrode. In an example embodiment, a bottom surface BH of the undoped region UP may be located at a higher vertical level than that of a bottom surface the third gate electrode 220_c. The second vertical channel portion PT2 may be formed adjacent to the doped region DP, and thus, the first vertical channel portion PT1 between the third gate electrode 220_c and the undoped region UP may be substantially in an intrinsic state.

Figure 9:
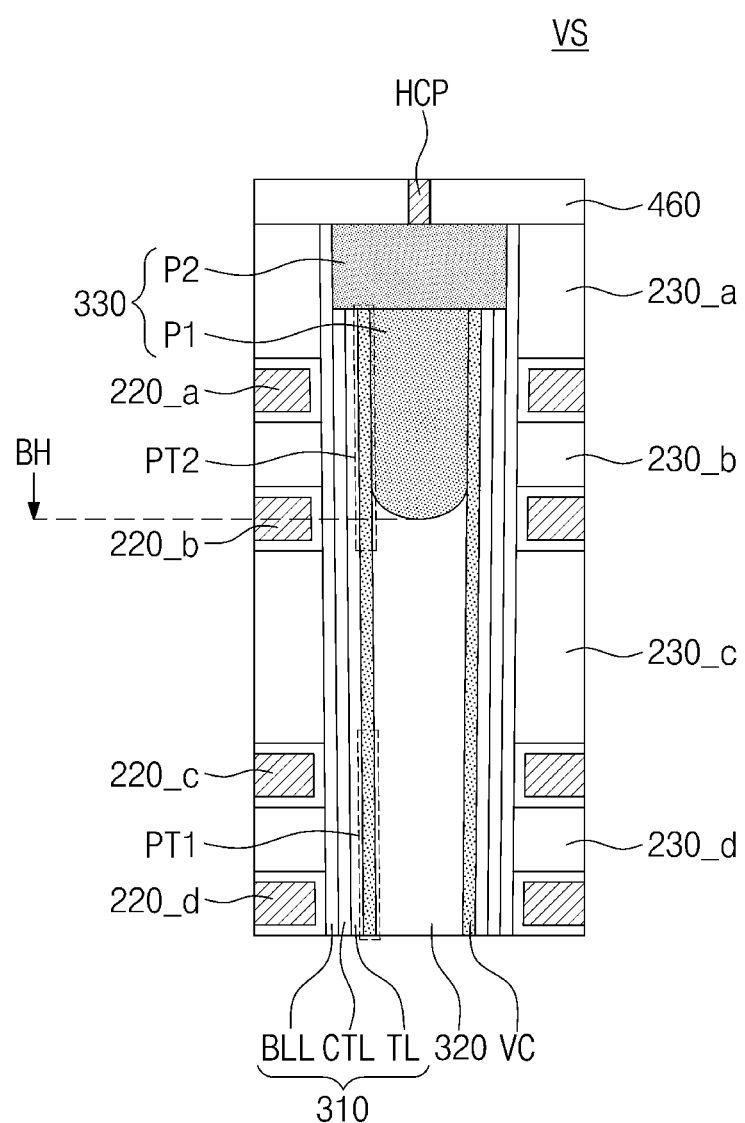

Referring to FIG. 9, an insulating pattern between the erase gate electrode and the string selection gate electrode may be thicker than the remaining ones of the insulating patterns. In an example embodiment, the first and second gate electrodes 220_a and 220_b may be used as the erase gate electrodes and the third and fourth gate electrodes 220_c and 220_d may be used as the string selection gate electrodes. In this case, an insulating pattern 230_c (hereinafter, a third insulating pattern) between the second gate electrode 220_b and the third gate electrode 220_c may be thicker than an insulating pattern 230_b (hereinafter, a second insulating pattern) between the first gate electrode 220_a and the second gate electrode 220_b and an insulating pattern 230_d (hereinafter, a fourth insulating pattern) between the third gate electrode 220_c and the fourth gate electrode 220_d. The third insulating pattern 230_c may be thicker than the first insulating pattern 230_a, but in an example embodiment, the first insulating pattern 230_a may be thicker than the third insulating pattern 230_c. In another embodiment, in which one erase gate electrode is provided, the second insulating pattern 230_b may be thicker than the third insulating pattern 230_c.

The second pad portion P2 may cover the top surface of the tunnel insulating layer TL and the top surface of the charge storing layer CTL and may be in contact with the side surface of the blocking insulating layer BLL. In other words, the blocking insulating layer BLL may be extended into a region between the second pad portion P2 and the first insulating pattern 230_a.

Figure 10:
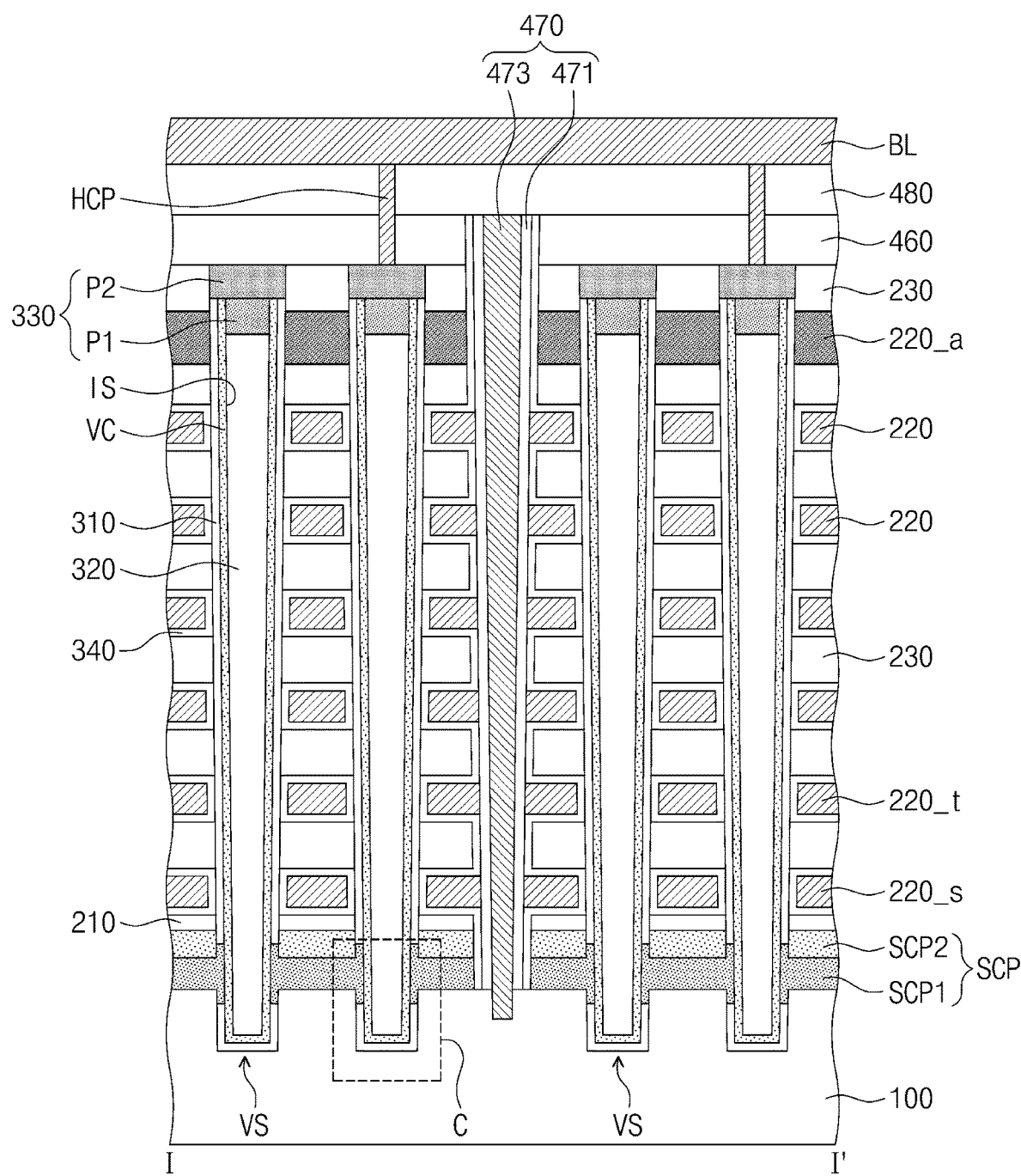
FIG. 10 is a sectional view, which is taken along line I-I' of FIG. 2, to illustrate a three-dimensional semiconductor memory device, according to an example embodiment of the inventive concept.
Figure 11:
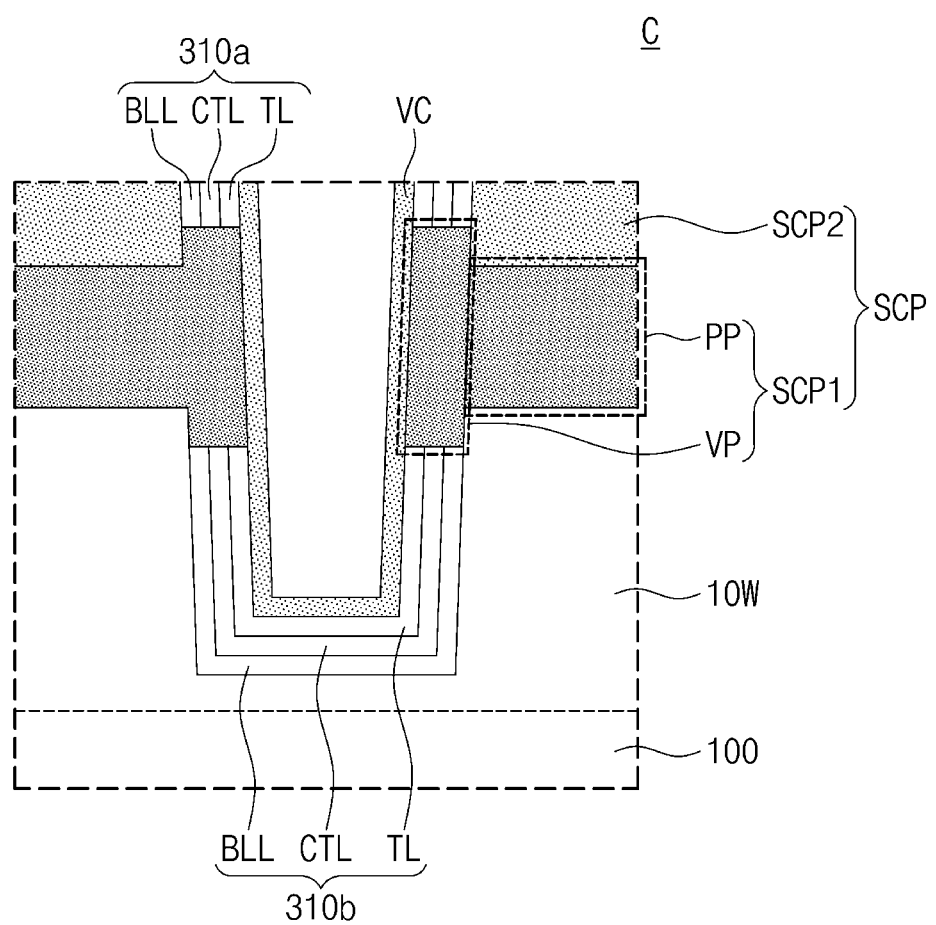
FIG. 11 is an enlarged sectional view of a portion 'C' of FIG. 10.
Figure 12:
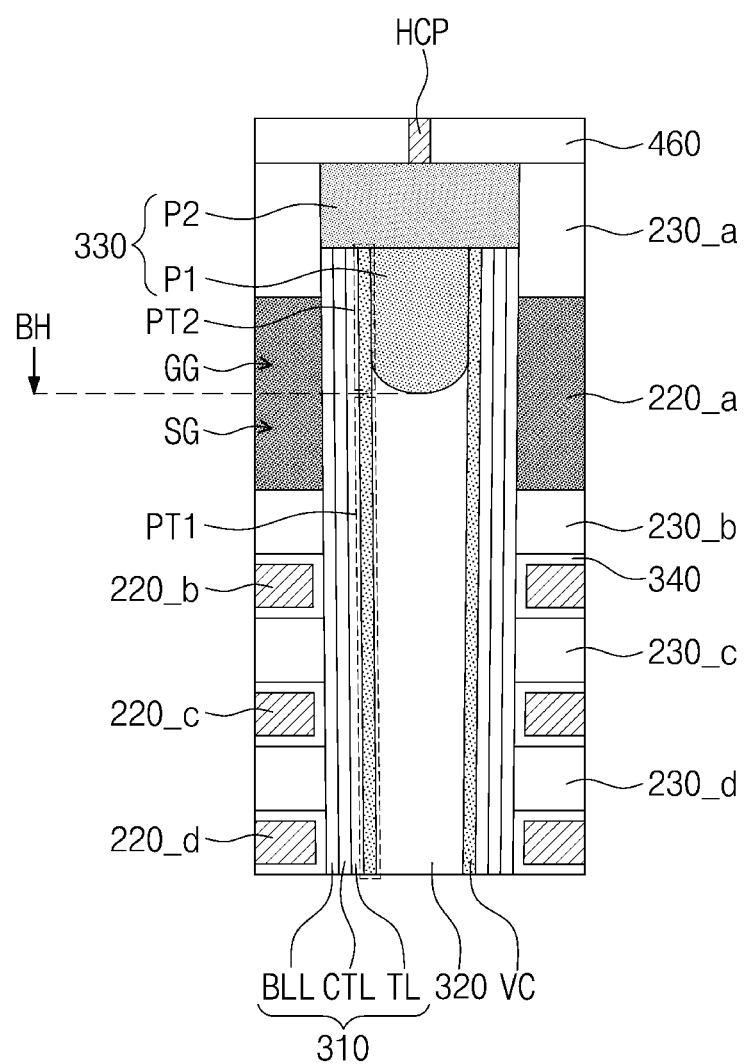
FIG. 12 is an enlarged sectional view of an upper portion of the vertical structure of FIG. 10.

FIG. 10 is a sectional view, which is taken along line I-I' of FIG. 2 to illustrate a three-dimensional semiconductor memory device according to an example embodiment of the inventive concept. FIG. 11 is an enlarged sectional view of a portion 'C' of FIG. 10. FIG. 12 is an enlarged sectional view of an upper portion of the vertical structure VS of FIG. 10. For concise description, a previously described element may be identified by a similar or identical reference number without repeating an overlapping description thereof.

Referring to FIGS. 10 to 12, a well impurity region 10W may be provided in the substrate 100. The well impurity region 10W may include impurities (e.g., phosphorus (P) or arsenic (As)), which have a different conductivity type from that of the substrate 100. Each of the stacks ST may include a source conductive pattern SCP, the buffer oxide layer 210 on the source conductive pattern SCP, and the gate electrodes 220 and the insulating patterns 230, which are alternately and repeatedly stacked on the buffer oxide layer 210.

The charge storing structure 310 may be provided to enclose the side surface of the vertical channel portion VC and may be interposed between the bottom surface of the vertical channel portion VC and the substrate 100. In other words, the vertical channel portion VC may be separated from the substrate 100. Lower portions of the vertical channel portions VC and lower portions of the charge storing structures 310 may be placed in the well impurity region 10W of the substrate 100. For example, the bottom surfaces of the vertical channel portions VC and the bottom surfaces of the charge storing structures 310 may be located at a lower level than the top surface of the substrate 100.

The source conductive pattern SCP may be disposed between the substrate 100 and the buffer oxide layer 210. The source conductive pattern SCP may include a first source conductive pattern SCP1 and a second source conductive pattern SCP2. The second source conductive pattern SCP2 may be disposed on a top surface of the first source conductive pattern SCP1. The first source conductive pattern SCP1 may be extended from a region between the substrate 100 and the second source conductive pattern SCP2 to other regions between the second source conductive pattern SCP2 and the vertical channel portion VC and between the substrate 100 and the vertical channel portion VC. The first source conductive pattern SCP1 may contact side surfaces of the vertical channel portions VC. Due to the first source conductive pattern SCP1, the charge storing structure 310 may be divided into an upper charge storing structure 310a, which is placed on the first source conductive pattern SCP1, and a lower charge storing structure 310b, which is placed below the first source conductive pattern SCP1.

In an example embodiment, the first source conductive pattern SCP1 may include a horizontal portion PP and a vertical portion VP. The horizontal portion PP of the first source conductive pattern SCP1 may be disposed between the substrate 100 and the second source conductive pattern SCP2. The vertical portion VP may be extended from a region between the vertical channel portion VC and the horizontal portion PP to other regions between the second source conductive pattern SCP2 and the vertical channel portion VC and between the substrate 100 and the vertical channel portion VC. The vertical portion VP may be in contact with the charge storing structure 310. For example, the vertical portion VP may contact a lower surface of the upper charge storing structure 310a and an upper surface of the lower charge storing structure 310b. A top surface of the vertical portion VP may be located at a vertical level between a top surface of the horizontal portion PP and a top surface of the second source conductive pattern SCP2. A bottom surface of the vertical portion VP may be located at a lower vertical level than the top surface of the substrate 100. The first source conductive pattern SCP1 may be in contact with the well impurity region 10W of the substrate 100, the second source conductive pattern SCP2, and the vertical channel portion VC. The first and second source conductive patterns SCP1 and SCP2 may be formed of a polysilicon layer, which is doped with impurities of the first conductivity type, and a concentration of impurities doped into the second source conductive pattern SCP2 may be higher than that in the first source conductive pattern SCP1. In an example embodiment, the common source region CSR of FIG. 3 may be omitted.

The source conductive pattern SCP may correspond to the lowermost element of the stack ST. The first gate electrode or uppermost electrode 220_a may be used as a first erase gate electrode, and the lowermost gate electrode 220_s may be used as a second erase gate electrode. A second lowermost gate electrode 220_t may be used as the ground selection gate electrode. The second gate electrode 220_b and the third gate electrode 220_c may be used as the string selection gate electrodes.

The first gate electrode 220_a may be thicker than the second gate electrode 220_b and the remaining gate electrodes therebelow. The first gate electrode 220_a may include a first gate portion GG, which is horizontally overlapped with the first pad portion P1, and a second gate portion SG, which is disposed below the first gate portion GG. The second vertical channel portion PT2 may be an impurity region of the first conductivity type. The first vertical channel portion PT1 may be substantially in an intrinsic state. The second gate portion SG, which is adjacent to the first vertical channel portion PT1 and is a lower portion of the first gate electrode 220_a, may be used as the string selection gate electrode. The first gate portion GG, which is adjacent to the second vertical channel portion PT2 and is an upper portion of the first gate electrode 220_a, may be used as an erase gate electrode. In the case where the first gate electrode 220_a is used as both of the erase gate electrode and the string selection gate electrode, it may be possible to reduce a thickness of the semiconductor device.

The first gate electrode 220_a may be formed of a material different from other gate electrodes disposed therebelow. As an example, the first gate electrode 220_a may be formed of a poly silicon material, and the other gate electrodes therebelow may be formed of a metallic material. The first gate electrode 220_a may be formed by using a poly silicon material for one of sacrificial layers in a fabrication process to be described with reference to FIG. 13. The horizontal insulating layer 340 may be provided between the second gate electrode 220_b and the vertical structures VS and between other gate electrodes disposed below the second gate electrode 220_b and the vertical structures VS, but the horizontal insulating layer 340 may not be provided between the first gate electrode 220_a and the vertical structures VS. The afore-described structures in the above embodiments may be mixed with each other. For example, the shapes of the pad portions and the structure and shape of the electrode, which have been described in the embodiments of FIGS. 5 to 9 and FIG. 12, may be mixed and/or interchanged with each other.

FIGS. 13 to 17 are sectional views, which are taken along a line I-I' of FIG. 2 to illustrate a method of fabricating a three-dimensional semiconductor memory device according to an example embodiment of the inventive concept.

Figure 13:
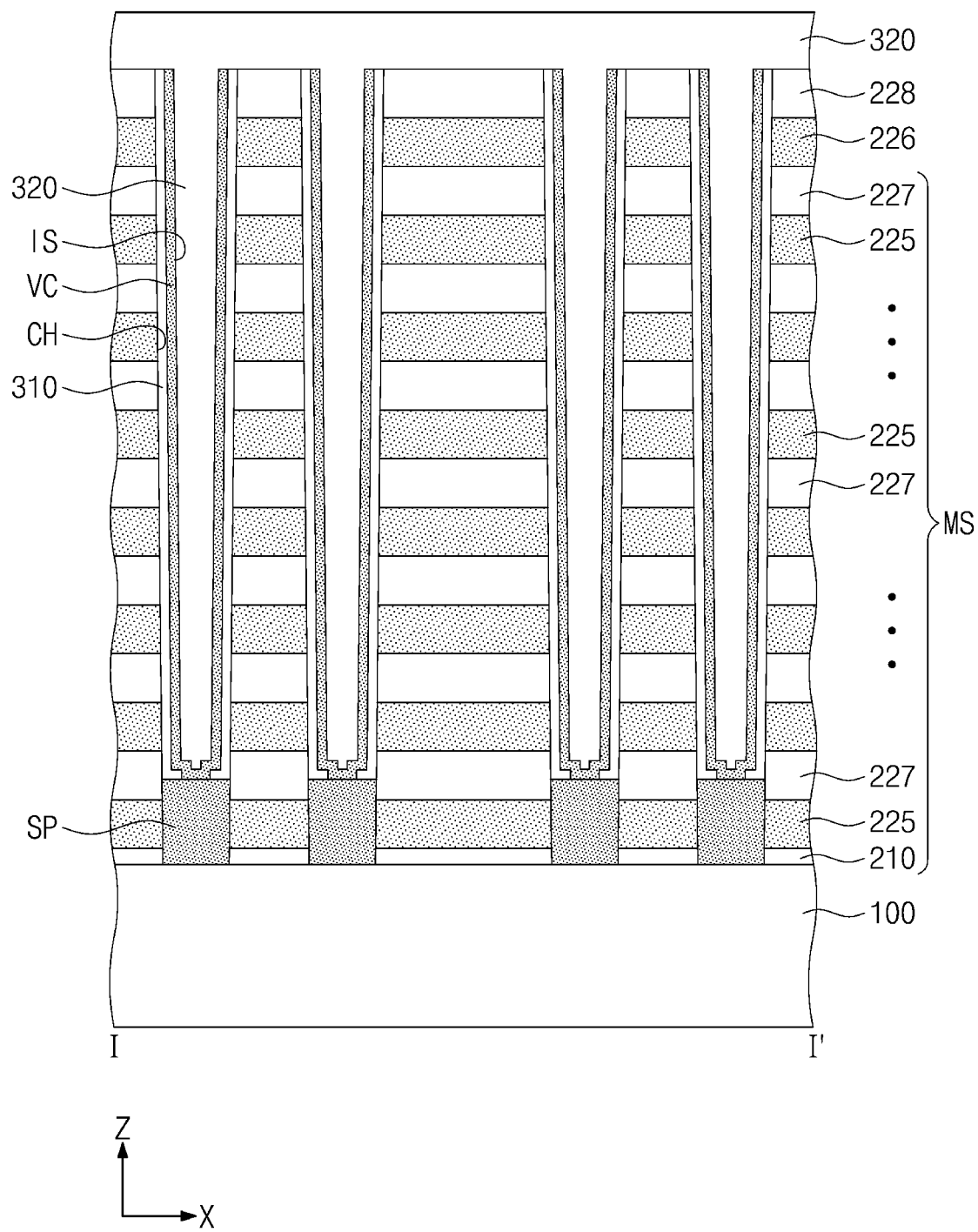
FIGS. 13 to 17 are sectional views, which are taken along a line I-I' of FIG. 2, to illustrate a method of fabricating a three-dimensional semiconductor memory device, according to an example embodiment of the inventive concept.

Referring to FIG. 13, a mold structure MS may be formed on the substrate 100. The formation of the mold structure MS may include forming the buffer oxide layer 210 on the substrate 100 and then alternately and repeatedly stacking sacrificial layers 225 and insulating layers 227 on the buffer oxide layer 210. The buffer oxide layer 210 may include, for example, a thermally-grown oxide layer or a silicon oxide layer. The sacrificial layers 225 may include, for example, a silicon nitride layer. The insulating layers 227 may be formed of a material having an etch selectivity with respect to the sacrificial layers 225. The insulating layers 227 may include, for example, a silicon oxide layer.

Channel holes CH may be formed by patterning the mold structure MS. The channel holes CH may be formed on the cell array region of the substrate 100. For example, the formation of the channel holes CH may include forming mask patterns 226 and 228 on the mold structure MS and anisotropically etching the mold structure MS using the mask patterns 226 and 228 as an etch mask. Due to an over-etching, the top surface of the substrate 100 may be partially recessed. The channel holes CH may have a circular, elliptical, or polygonal shape, when viewed in a plan view.

The semiconductor pillars SP may be formed in the channel holes CH. The semiconductor pillars SP may be grown from the substrate 100 by a selective epitaxial growth process, in which using the substrate 100 exposed by the channel holes CH is used as a seed layer. The charge storing structures 310 may be formed on side surfaces of the channel holes CH. The charge storing structures 310 may be formed to cover the side surfaces of the channel holes CH and to partially cover top surfaces of the semiconductor pillars SP exposed by the channel holes CH. As shown in FIG. 5, each of the charge storing structures 310 may include the blocking insulating layer BLL, the charge storing layer CTL, and the tunnel insulating layer TL, which are sequentially stacked on the side surface of each channel hole CH. The blocking insulating layer BLL may be, for example, a silicon oxide layer or a high-k dielectric layer (e.g., $Al_2O_3$ or $HfO_2$), the charge storing layer CTL may be, for example, a silicon nitride layer, and the tunnel insulating layer TL may be, for example, a silicon oxide layer or a high-k dielectric layer (e.g., $Al_2O_3$ or $HfO_2$).

The vertical channel portions VC may be formed in the channel holes CH. The vertical channel portions VC may conformally cover inner surfaces of the charge storing structures 310 and the top surface of the substrate 100 exposed by the charge storing structures 310. In a hydrogen- or deuterium-containing gas ambience, a hydrogen annealing process may be performed on the vertical channel portions VC. In the case where crystal defects exist in the vertical channel portions VC, they may be cured by the hydrogen annealing process.

The gap-fill layer 320 may be formed in the internal spaces IS surrounded by the vertical channel portions VC. The gap-fill layer 320 may be formed to fully fill the internal spaces IS. The gap-fill layer 320 may be formed by a spin-on-glass (SOG) process or an atomic layer deposition process. The gap-fill layer 320 may include an insulating material (e.g., a silicon oxide layer).

Figure 14:
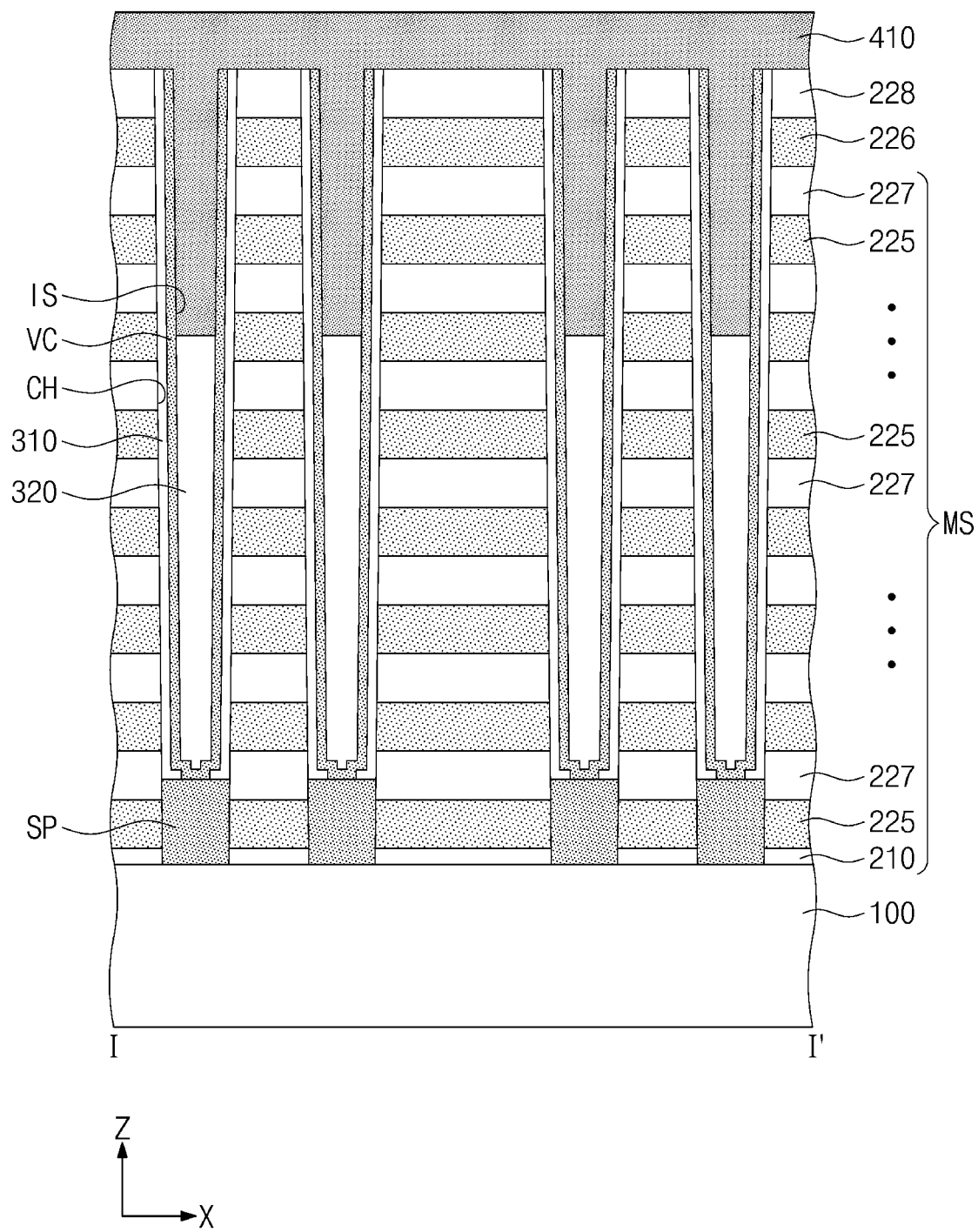

Referring to FIG. 14, an etching process may be performed to etch upper portions of the gap-fill layers 320, which are separated from each other. Thus, upper portions of the internal spaces IS may be exposed above top surfaces of the gap-fill layers 320. The etching process may include an etch-back process. A first semiconductor layer 410 may be formed on the mold structure MS. The first semiconductor layer 410 may be formed to cover the top surface of the mold structure MS and to fill the re-exposed upper portions of the internal spaces IS on the gap-fill layers 320. The first semiconductor layer 410 may be formed of or may include an undoped or intrinsic semiconductor material. As an example, the first semiconductor layer 410 may be formed of an intrinsic poly silicon layer.

Figure 15:
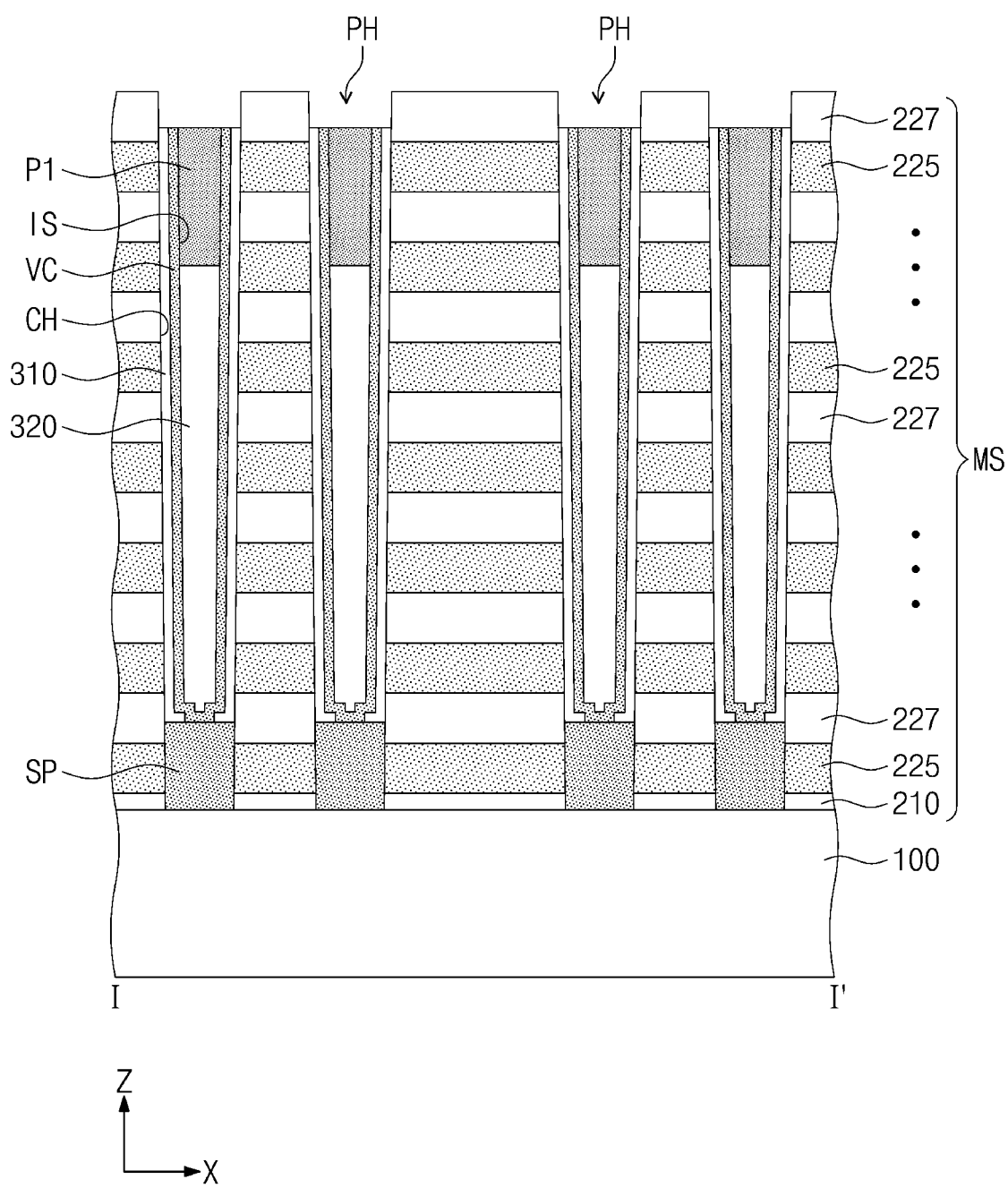

Referring to FIG. 15, a planarization process may be performed on the first semiconductor layer 410, and as a result, the first pad portions P1 may be formed in the internal spaces IS and on the gap-fill layers 320. The planarization process may be performed to remove the mask patterns 226 and 228. In an example embodiment, the planarization process may include a chemical mechanical polishing (CMP) process.

An upper portion of each of the first pad portions P1, the charge storing structures 310, and the vertical channel portions VS may be etched to form pad holes PH. The pad holes PH may be formed to have bottom surfaces that are higher than a top surface of the uppermost sacrificial layer 225. The formation of the pad holes PH may include a plurality of dry and/or wet etching processes. Unlike the structure illustrated in the drawings, at least one of layers constituting the charge storing structures 310 may remain, as shown in FIG. 9.

Figure 16:
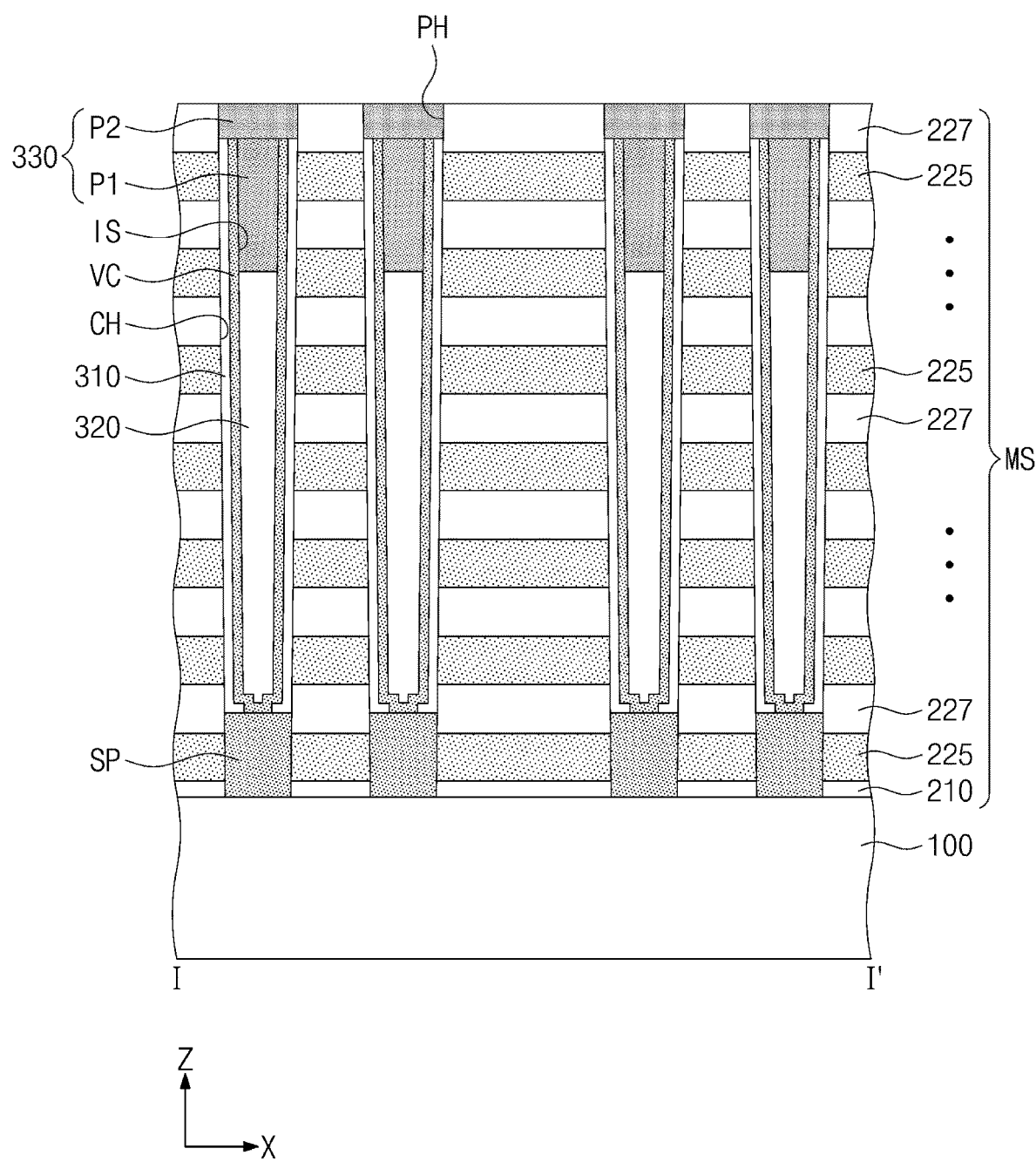

Referring to FIG. 16, the second pad portions P2 may be formed on the first pad portions P1. The formation of the second pad portions P2 may include forming a second semiconductor layer to fill the pad holes PH and performing a planarization process on the second semiconductor layer. The second semiconductor layer may include a semiconductor material of the first conductivity type. As an example, the second semiconductor layer may be a highly-doped n-type poly silicon layer. The second semiconductor layer may be doped in an in-situ manner. Since the second pad portions P2 are formed at a relatively shallow depth, it may be possible to prevent a void or seam from being formed in the second pad portions P2.

As a result of the formation of the second pad portions P2, a process of forming the pads 330 including the first pad portions P1 and the second pad portions P2 may be finished. The first conductivity type impurities in the second pad portions P2 may be diffused into at least a portion of the first pad portions P1 and into upper portions of the vertical channel portions VC adjacent thereto, during a subsequent thermal process.

Figure 17:
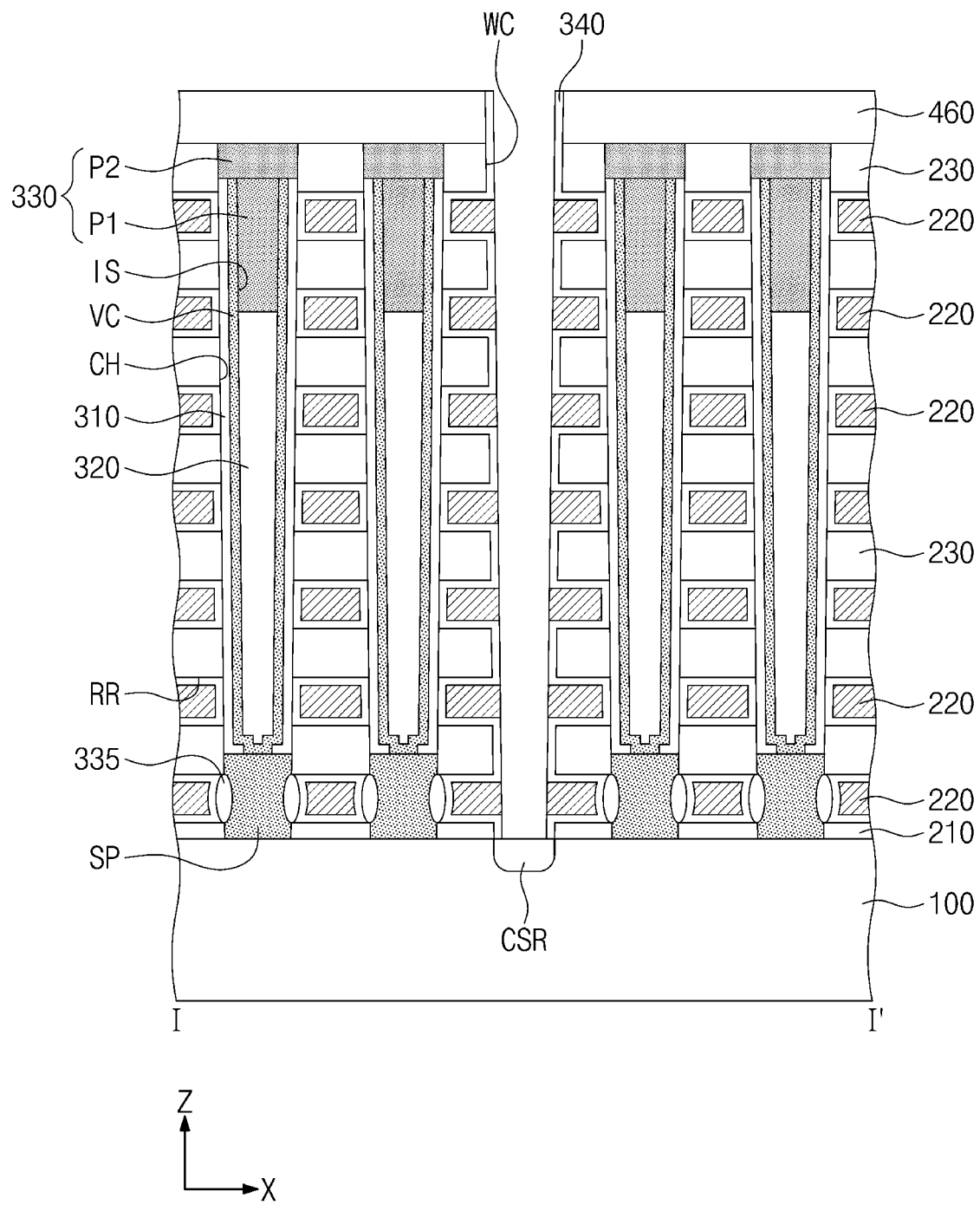

Referring to FIG. 17, an anisotropic etching process may be performed on the mold structure MS to form the separation trench WC. The formation of the separation trench WC may include forming the first interlayered insulating layer 460 on the mold structure MS and pattering the mold structure MS to expose the top surface of the substrate 100. The separation trench WC may extend in the second direction Y (see, e.g., FIG. 2). Accordingly, the separation trench WC may be formed to have a line shape or a rectangular shape extending in the second direction Y. The sacrificial layers 225 exposed by the separation trench WC may be removed to form recess regions RR. The sacrificial layers 225 may be removed by a wet etching process and/or an isotropic dry etching process. As an example, the etching process may be performed using an etching solution containing phosphoric acid. The gate insulating layer 335 may be formed on side surfaces of the semiconductor pillars SP exposed by the recess regions RR. The gate insulating layer 335 may be formed by performing an oxidation process on side surfaces of the semiconductor pillars SP. The gate insulating layer 335 may include, for example, a thermally-grown oxide layer or a silicon oxide layer.

The horizontal insulating layer 340 may be formed in the recess regions RR. For example, the horizontal insulating layer 340 may be formed to conformally cover outer sidewalls of the charge storing structures 310, side surfaces of the gate insulating layer 335, and top, bottom, and side surfaces of the insulating patterns 230, which are exposed by the recess regions RR. The horizontal insulating layer 340 may be formed by using a deposition method having a good step-coverage property. For example, the horizontal insulating layer 340 may be formed by a chemical vapor deposition (CVD) process or an atomic layer deposition (ALD) process. The gate electrodes 220 may be formed in the recess regions RR. The formation of the gate electrodes 220 may include forming a metal layer to fill the separation trench WC and the recess regions RR and then removing the metal layer from the separation trench WC.

The common source region CSR may be formed in the substrate 100 exposed by the separation trench WC. The common source region CSR may be exposed by an ion implantation process. The common source region CSR may have the first conductivity type.

Referring back to FIGS. 2 to 4, the contact structure 470 may be formed in the separation trench WC. The contact structure 470 may include the spacer 471 and the common source contact 473. The spacer 471 may cover the side surfaces of the separation trench WC. The common source contact 473 may be formed to fill a remaining unfilled space of the separation trench WC, in which the spacer 471 is formed. The second interlayered insulating layer 480 may be formed on the first interlayered insulating layer 460. The second interlayered insulating layer 480 may cover a top surface of the contact structure 470 and a top surface of the first interlayered insulating layer 460. The second interlayered insulating layer 480 may include, for example, a silicon oxide layer.

The channel contact plugs HCP may be formed on the vertical channel portions VC. The channel contact plugs HCP may penetrate the second and first interlayered insulating layers 480 and 460 and may be in contact with the pads 330. The bit lines BL may be formed on the second interlayered insulating layer 480. The bit lines BL may be electrically connected to the vertical channel portions VC, which are arranged in the first direction X.

According to an example embodiment of the inventive concept, an erase gate electrode, which is the topmost electrode of gate electrodes, may be horizontally overlapped with a first pad portion provided in an internal space surrounded by a vertical channel portion. Thus, during an erase operation, a gate-induced drain leakage (GIDL) phenomenon may be easily induced between the erase gate electrode and the pad, and thus, holes may be easily supplied into the vertical channel portions. According to an example embodiment of the inventive concept, it may be possible to prevent a void or seam from being formed in the pad portion. According to an example embodiment of the inventive concept, it may be possible to reduce a thickness of a semiconductor device.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
a stack including gate electrodes and insulating patterns alternately and repeatedly stacked on a substrate; and
a vertical structure penetrating the stack, the vertical structure comprising a vertical channel portion, a charge storing structure on an outer side surface of the vertical channel portion, and a pad,
wherein the pad comprises:
a first pad portion disposed in an internal space of the vertical structure and surrounded by the vertical channel portion; and
a second pad portion provided on the first pad portion and extended onto a top surface of the charge storing structure,
wherein a portion of the first pad portion is disposed at a same level as an uppermost electrode of the gate electrodes,
wherein the vertical structure includes first, second, and third vertical structures sequentially disposed along a first direction and adjacent to each other, and wherein second pads of the first, second, and third vertical structures are spaced apart from each other by a topmost layer of the insulating patterns therebetween.

2. The device of claim 1, wherein the portion of the first pad portion disposed at the same level as the uppermost electrode comprises a semiconductor material of a first conductivity type.

3. The device of claim 2, wherein a portion of the vertical channel portion disposed at the same level as the uppermost electrode comprises a semiconductor material of the first conductivity type.

4. The device of claim 1, wherein a second portion of the first pad portion is disposed at a same level as a second uppermost electrode of the gate electrodes.

5. The device of claim 4, wherein the first pad portion is disposed at a higher level than a top surface of a third uppermost electrode of the gate electrodes.

6. The device of claim 4, wherein a portion of the vertical channel portion disposed at a same level as a third uppermost electrode of the gate electrodes is substantially in an intrinsic state.

7. The device of claim 4, wherein a lowermost surface of the first pad portion is disposed at a same level as the second uppermost electrode.

8. The device of claim 1, wherein the second pad portion comprises a semiconductor material of a first conductivity type.

9. The device of claim 1,
wherein the portion of the first pad portion disposed at a same level as the uppermost electrode comprises a semiconductor material of a first conductivity type, and
wherein the first pad portion includes a second portion and the second portion of the first pad portion is disposed below the portion and is substantially in an intrinsic state.

10. The device of claim 1, wherein an upper portion of the first pad portion has a higher doping concentration than that of a lower portion of the first pad portion.

11. The device of claim 10, wherein a doping concentration of the first pad portion increases along a direction from a bottom surface of the first pad portion toward a top surface of the first pad portion.

12. The device of claim 1, wherein a grain density of the vertical channel portion is higher than that of the first pad portion.

13. The device of claim 1, wherein the uppermost electrode comprises:
a first gate portion disposed at a same level as the first pad portion; and
a second gate portion disposed below the first pad portion,
wherein a portion of the vertical channel portion disposed at a same level as the first gate portion is of a first conductivity type, and
wherein another portion of the vertical channel portion disposed at a same level as the second gate portion is substantially in an intrinsic state.

14. The device of claim 13, wherein the uppermost electrode is thicker than a second uppermost electrode of the gate electrodes.

15. A three-dimensional semiconductor memory device, comprising:
a stack including gate electrodes and insulating patterns alternately and repeatedly stacked on a substrate; and
a vertical structure penetrating the stack, the vertical structure comprising a vertical channel portion, a charge storing structure on an outer side surface of the vertical channel portion, and a pad,
wherein the pad comprises:
a first pad portion disposed in an internal space of the vertical structure and surrounded by the vertical channel portion; and
a second pad portion provided on the first pad portion and extended onto a top surface of the charge storing structure,
wherein a portion of the first pad portion is disposed at a same level as an uppermost electrode of the gate electrodes, and
wherein an upper surface of the second pad portion is at the same level as an upper surface of an uppermost one of the insulating patterns.

16. The device of claim 15,
wherein the portion of the first pad portion disposed at the same level as the uppermost electrode comprises a semiconductor material of a first conductivity type, and
wherein a portion of the vertical channel portion disposed at the same level as the uppermost electrode comprises a semiconductor material of the first conductivity type.

17. The device of claim 1, wherein the second pad portion does not overlap with the gate electrodes.

18. The device of claim 1, wherein a diameter of the second pad portion is the same with or smaller than a diameter of the charge storing structure.

19. The device of claim 1, wherein the vertical structure is disposed in a channel hole penetrating the stack, and wherein both the first pad portion and the second pad portion are provided within the channel hole.

20. The device of claim 1, wherein the second pads of the first, second, and third vertical structures are electrically separated from each other by the topmost layer of the insulating patterns therebetween.

* * * * *